United States Patent
Liu et al.

(10) Patent No.: US 7,965,028 B2
(45) Date of Patent: Jun. 21, 2011

(54) WHITE LIGHT EMITTING DEVICE AND PRODUCING METHOD THEREOF

(75) Inventors: Yu-Huan Liu, Hsinchu (TW); Chieh-Hsiu Lin, Hsinchu (TW); Chih-Lin Wang, Hsinchu (TW); Yun-Yi Tien, Hsinchu (TW)

(73) Assignee: Au Optronics Corporation, Hsinchu (TW)

(*) Notice: Subject to any disclaimer, the term of this patent is extended or adjusted under 35 U.S.C. 154(b) by 527 days.

(21) Appl. No.: 12/106,348

(22) Filed: Apr. 21, 2008

(65) Prior Publication Data

US 2009/0153024 A1    Jun. 18, 2009

(30) Foreign Application Priority Data

Dec. 12, 2007   (TW) ................................ 96147469 A

(51) Int. Cl.
*H01L 51/00* (2006.01)
(52) U.S. Cl. ........................................ 313/498; 313/506
(58) Field of Classification Search ........... 313/498–512
See application file for complete search history.

(56) References Cited

U.S. PATENT DOCUMENTS

| | | | |
|---|---|---|---|
| 6,576,930 B2 | 6/2003 | Reeh et al. | |
| 7,045,375 B1 | 5/2006 | Wu et al. | |
| 7,432,642 B2 * | 10/2008 | Murazaki | 313/486 |
| 2003/0122482 A1 * | 7/2003 | Yamanaka et al. | 313/512 |
| 2003/0151357 A1 * | 8/2003 | Uemura | 313/506 |
| 2004/0183088 A1 | 9/2004 | DenBaars et al. | |
| 2006/0082296 A1 | 4/2006 | Chua et al. | |
| 2007/0085105 A1 * | 4/2007 | Beeson et al. | 257/100 |

FOREIGN PATENT DOCUMENTS

| | | |
|---|---|---|
| CN | 1170383 | 1/1998 |
| CN | 1467888 | 1/2004 |
| CN | 1773703 | 5/2006 |
| TW | I229465 | 3/2005 |
| TW | I233706 | 6/2005 |
| TW | I243489 | 11/2005 |

OTHER PUBLICATIONS

"3rd Office Action of China counterpart application", issued on Sep. 18, 2009, p. 1-p. 6.

* cited by examiner

*Primary Examiner* — Anne M Hines
(74) *Attorney, Agent, or Firm* — Jianq Chyun IP Office

(57) ABSTRACT

A white-light emitting device comprises a substrate, a short wavelength light source, a protective layer, a first structure, and a second structure. The short wavelength light source is disposed on the substrate for generating a first light, and the protective layer covering the short wavelength light source is pervious to the first light. The first structure is disposed on the protective layer for generating a second light, in which the first structure includes a first quantum well and a transmission layer. The second structure is disposed on the first structure for generating a third light. Finally, the first light, the second light, and the third light are mixed to generate a white light.

17 Claims, 3 Drawing Sheets

WHITE LIGHT EMITTING DEVICE AND PRODUCING METHOD THEREOF

CROSS-REFERENCE TO RELATED APPLICATION

This application claims the priority benefit of Taiwan application serial no. 96147469, filed on Dec. 12, 2007. The entirety the above-mentioned patent application is hereby incorporated by reference herein and made a part of specification.

BACKGROUND OF THE INVENTION

1. Field of the Invention

The present invention relates to a semiconductor optoelectronic device, and particularly relates to a white-light emitting device.

2. Description of Related Art

A light emitting diode has the advantages of longer lifetime, quick response, small volume, energy saving, and low pollution (mercury free), and therefore gradually replaces conventional fluorescent lamps and incandescent bulbs.

A white light is a mixture of several lights, which mainly comprises red light, blue light, and green light. Currently, most white-light emitting diodes consist of a blue chip and a yellow fluorescent powder structure. Although the light-emitting efficiency thereof is satisfactory, the chromatic range is too narrow to cover wide chromatic range.

FIG. 1 is a schematic cross-sectional view of a conventional white-light emitting diode 10. Referring to FIG. 1, a structure of a conventional white-light emitting diode 10 comprises a circuit substrate 101, a chip substrate 106, electrodes 103a and 103b, a hole source layer 107, blue-light active layer 109, and an electron source layer 111. A transparent protective layer 105 comprises a fluorescent powder material (for example, yellow fluorescent powder or red and green fluorescent powder) to protect electrodes 103a and 103b, the hole source layer 107, the blue-light active layer 109, and the electron source layer 111.

The principle of the conventional white-light emitting diode 10 utilizes a fluorescent powder material to absorb blue light from a light source so as to generate a yellow light or red and green light. The yellow light or the red and green light is then mixed with blue light from the blue-light active layer 109 to generate a white light. However, the chromatic range of the conventional white-light emitting diode 10 is narrower, and therefore can not be applied to an apparatus which requires wider chromatic range, such as a display panel.

SUMMARY OF THE INVENTION

Accordingly, the present invention provides a white-light emitting device and a producing method thereof. The white-light emitting device has a single-device structure, which can simplify the structure, lower the cost, increase chromatic range, and enhance color saturation.

The present invention further provides a white-light emitting device, which comprises a substrate, a short wavelength light source, a protective layer, a first structure, and a second structure. The short wavelength light source is disposed on the substrate for generating a first light. The protective layer covers the short wavelength light source and is pervious to the first light. The first structure is disposed on the protective layer for generating a second light, and the first structure comprises a first quantum well layer disposed on the protective layer and a transmission layer disposed on the first quantum well. The second structure is disposed on the first structure for generating a third light. The first light, the second light, and the third light are further mixed to generate a white light.

The present invention provides a producing method of a white-light emitting device, which comprises: providing a substrate, forming a short wavelength light source on the substrate for generating a first light, forming a protective layer to cover the short wavelength light source, forming a first structure on the protective layer for generating a second light, forming a second structure on the first structure for generating a third light, and mixing the first light, the second light, and the third light to generate a white light.

The white-light emitting device of the present invention has a single-device structure, which features simple electrode design and low power consumption when compared with a conventional white-light emitting diode. In addition, the white-light emitting device of the present invention has lower production cost and is therefore suitable for mass production. A white light generated by the white-light emitting device is a mixture of red light, blue light, and green light, and the white light has better color saturation.

To make the above and other objectives, features, and advantages of the present invention more comprehensible, several embodiments accompanied with figures are described in details as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
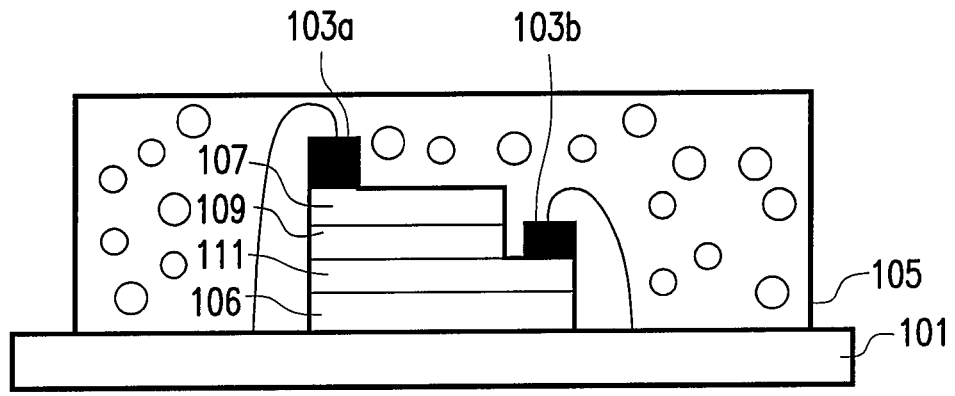
FIG. 1 is a schematic cross-sectional view of a conventional white-light emitting diode.

The following description is presented with figures to detail the embodiments of the present invention. In the figures, identical or similar reference numerals are used to indicate identical or similar elements. Please note that the figures are simplified and therefore not proportionally accurate. In addition, indications of directions, such as up, down, left, right, on, under, above, below, lower, in back of, in front of, and so on, in the following descriptions serve to clearly explain the present invention and should be referred to the appended figures only. It is apparent to persons of ordinary knowledge in this field that these indications of directions shall not restrict the scope or spirit of the present invention.

Figure 2:
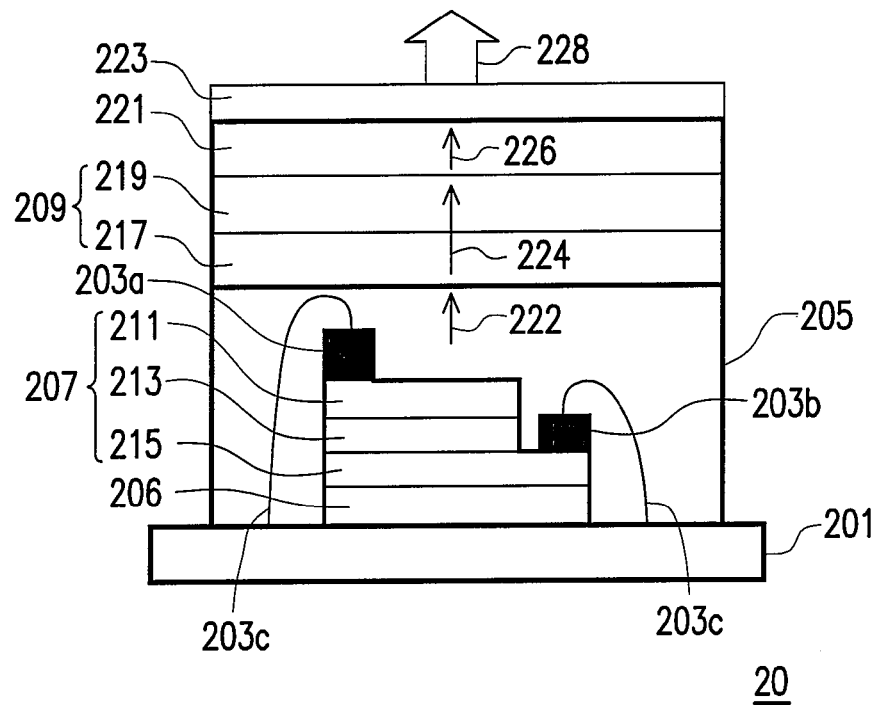
FIG. 2 is a schematic cross-sectional view of a white-light emitting device according to the first embodiment of the present invention.

FIG. 2 is a schematic cross-sectional view of a white-light emitting device according to the first embodiment of the present invention. Referring to FIG. 2, the embodiment provides a white-light emitting device 20, which comprises a circuit substrate 201, a substrate 206 disposed on the circuit substrate 201, a first electrode 203a, a second electrode 203b, a short wavelength light source 207, a protective layer 205, a first structure 209, and a second structure 221.

The short wavelength light source 207 is disposed on the substrate 206 and electrically connected to the circuit substrate 201 by the first electrode 203a, the second electrode 203b, and conductive lines 203c. The short wavelength light source 207 is electrified to generate a first light 222, which is, for example, blue light. The protective layer 205 covers the short wavelength light source 207. According to the embodiment, the protective layer 205 and the circuit substrate 201 form a hermetic chamber, in which the short wavelength light source 207 is disposed and isolated from external influences, for example, suspending particles contained in the air or moisture. The protective layer 205 is pervious to the first light 222. The first structure 209 is disposed on the protective layer 205. By photoelectric effect, the first structure 209 absorbs partial energy of the first light 222 to generate a second light 224. The second structure 221 is disposed on the first structure 209 to generate a third light 226. A white light is then generated by mixing the first light, the second light, and the third light.

In the embodiment, the short wavelength light source 207 comprises a hole source layer 211, an active layer 213, and an electron source layer 215. The electron source layer 215 is disposed on the substrate 206 and electrically connected to the circuit substrate 201 by the first electrode 203b and the conductive line 203c. The active layer 213 is disposed on the electron source layer 215. The first light generated by the short wavelength light source 207 is generated by the active layer 213. The hole source layer 211 is disposed on the active layer 213 and electrically connected to the circuit substrate 201 by the second electrode 203a and the conductive line 203c.

Moreover, in the embodiment, the first structure 209 comprises a first quantum well layer 217 disposed on the protective layer 205 and a transmission layer 219 disposed on the first quantum well 217. The first quantum well layer 217 absorbs a portion of the first light 222 to generate the second light 224. The second structure 221 is, for example, a second quantum well structure which absorbs a portion of the first light 222 or a portion of the second light 224, or simultaneously absorbs a portion of the first light 222 and a portion of the second light 224 to generate the third light 226. A white light 228 is then generated by mixing the first light 222, the second light 224, and the third light 226. In the embodiment, the second light 224 is green light and the third light 226 is red light, for example.

The white-light emitting device 20 of the first embodiment further comprises a protective layer 223 which is disposed on the second structure 221 to isolate the second structure 221 from external influences, for instance, suspending particles contained in the air or moisture, and the protective layer 223 is pervious to the first light 222, the second light 224, and the third light 226.

In the embodiment, the first structure 209 emits light by photo luminary (PL). After the first structure 209 absorbs the first light 222 generated by the short wavelength light source 207, electrons in the first quantum well layer 217 of the first structure 209 absorb sufficient energy and are excited to move from a valence band to a conductive band. Because the excited electrons are unstable, they then return to the valence band from the conductive band. Thereby, the electrons release the energy absorbed in the form of light. This PL light emitting method is also applicable in the following embodiments and therefore not repeated hereafter.

Following the preceding paragraphs, the materials of the white-light emitting device 20 are detailed as follows: A material of the substrate 206 is GaAs, GaP, InP, Si, SiC, or sapphire material.

A material of the protective layer 205 is a transparent high-molecular polymer material, such as Epoxy, Silicone, Polycarbonate (PC), or Polymethylmethacrylate (PMMA).

A material of the first electrode 203a and the second electrode 203b is an electric conductive material or an electric conductive metal oxide, wherein the electric conductive metal oxide comprises at least one of indium tin oxide, aluminum zinc oxide, indium zinc oxide, or cadmium tin oxide, and the electric conductive metal oxide is formed by sputtering or ion plating.

A material of the hole source layer 211 and the electron source layer 215 of the short wavelength light source 207 is a p-type material or a n-type material. A material of the active layer 213 of the short wavelength light source 207 consists of III-V Group nitride, such as a gallium nitride.

In addition, a material of the first quantum well layer 217 of the first structure 209 is either the same as the material of the active layer 213 or AlInGaP, InGaN, or homogeneous materials with compositions in different proportion. A material of the transmission layer 219 comprises at least one of Epoxy, Silicone, Polycarbonate (PC), Polymethylmethacrylate (PMMA), plastic, polymer, glass, or silicon.

If the second structure 211 is, for example, a second quantum well structure, a material thereof is either the same as the material of the active layer 213 or AlInGaP, InGaP, AlGaAs, or homogeneous materials with compositions in different proportion. A material of the protective layer 223 comprises at least one of Epoxy, Silicone, Polycarbonate (PC), Polymethylmethacrylate (PMMA), plastic, polymer, glass, or silicon.

Figure 3:
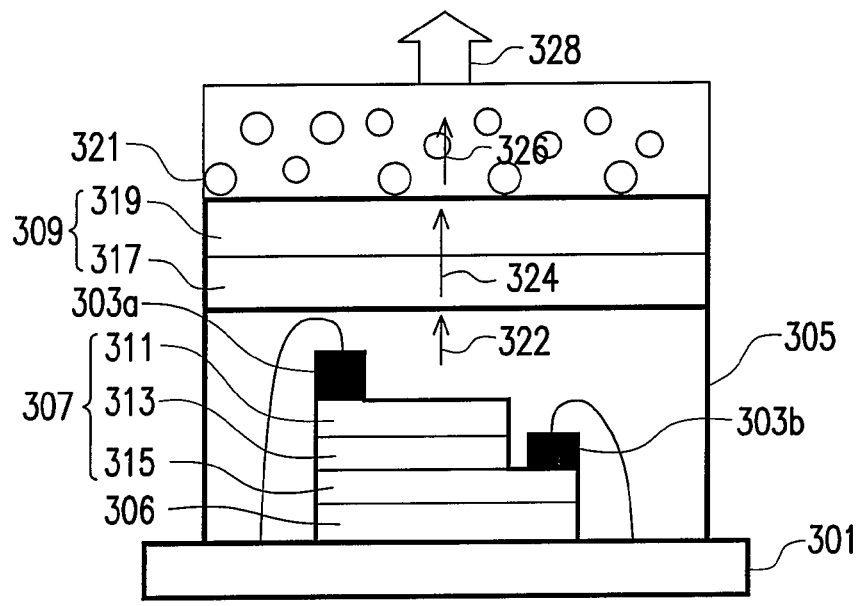
FIG. 3 is a schematic cross-sectional view of a white-light emitting device according to the second embodiment of the present invention.

FIG. 3 is a schematic cross-sectional view of a white-light emitting device 30 according to the second embodiment of the present invention. In this embodiment, the white-light emitting device 30 comprises a circuit substrate 301, a substrate 306, a first electrode 303a, a second electrode 303b, a short wavelength light source 307, a protective layer 305, a first structure 309, and a second structure 321. Similar to the first embodiment, the short wavelength light source 307 comprises a hole source layer 311, an active layer 313, and an electron source layer 315. In addition, the first structure 309 also comprises a first quantum well layer 317 and a transmission layer 319. Persons of ordinary knowledge in this field may refer to the first embodiment for descriptions related to the above.

What distinguishes the second embodiment from the first embodiment is that the second structure 321 in the second embodiment is, for example, a fluorescent layer structure which absorbs a portion of a first light 322 or a portion of a second light 324, or simultaneously absorbs a portion of the first light 322 and a portion of the second light 324 to generate a third light 326. A white light 328 is then generated by mixing the first light 322, the second light 324, and the third light 326. In this embodiment, the second light 324 is green light and the third light 326 is red light, for example.

Figure 4:
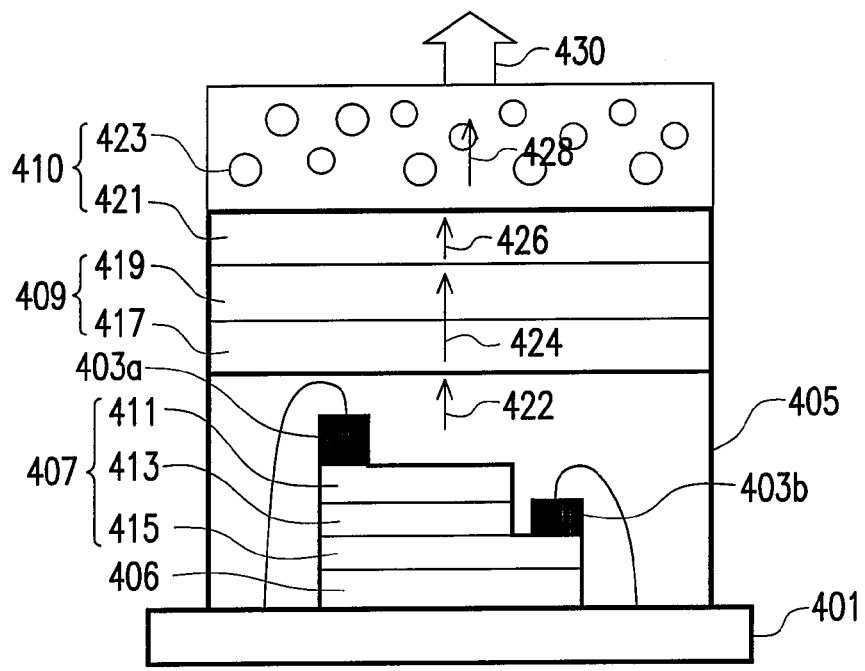
FIG. 4 is a schematic cross-sectional view of a white-light emitting device according to the third embodiment of the present invention.

FIG. 4 is a schematic cross-sectional view of a white-light emitting device 40 according to the third embodiment of the present invention. Referring to FIG. 4, the embodiment provides a white-light emitting device 40, which comprises a circuit substrate 401, a substrate 406, a first electrode 403a, a second electrode 403b, a short wavelength light source 407, a protective layer 405, a first structure 409, and a second structure 410. Similar to the first and the second embodiments, the first structure 409 comprises a first quantum well layer 417 and a transmission layer 419. In addition, the short wavelength light source 407 comprises a hole source layer 411, an active layer 413, and an electron source layer 415. In this embodiment, the short wavelength light source 407 is electrified to generate a first light 422, which is preferably a non-visible light.

What distinguishes the third embodiment from the previous embodiments is that the second structure 410 comprises, for example, a second quantum well structure 421 and a fluorescent layer structure 423 for generating a third light 426 and a fourth light 428. In this embodiment, the second quantum well structure 421 absorbs a portion of the first light 422, a portion of the second light 424, or simultaneously absorbs a portion of the first light 422 and a portion of the second light 424 to generate a portion of the third light 426. In addition, the fluorescent layer structure 423 absorbs a portion of the first light 422, a portion of the second light 424, and a portion of the third light 426; or merely absorbs a portion of the first light 422 and a portion of the second light 424; or merely absorbs a portion of the first light 422 to generate a fourth light 428. The white-light emitting device 40 then generates a white light 430 by mixing the second light 424, the third light 426, and the fourth light 428. In this embodiment, the first light 422 is an ultraviolet light, the second light 424 is blue light, the third light 426 is green light, and the fourth light 428 is red light, for example.

Figure 5:
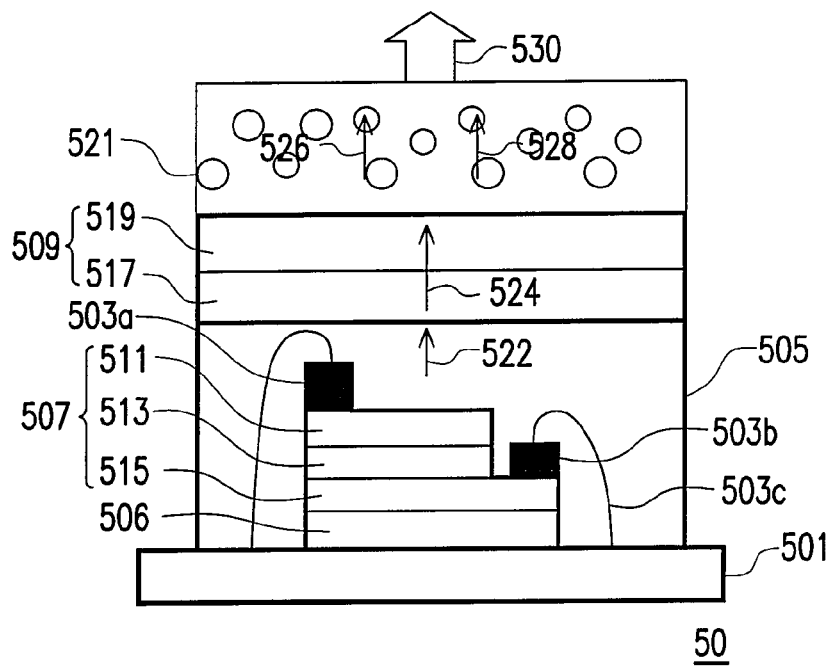
FIG. 5 is a schematic cross-sectional view of a white-light emitting device according to the fourth embodiment of the present invention.

FIG. 5 is a schematic cross-sectional view of a white-light emitting device 50 according to the fourth embodiment of the present invention. Referring to FIG. 5, the embodiment provides a white-light emitting device 50, which comprises a circuit substrate 501, a substrate 506, a first electrode 503a, a second electrode 503b, a short wavelength light source 507, a protective layer 505, a first structure 509, and a second structure 521. Similarly, the first structure 509 comprises a first quantum well layer 517 and a transmission layer 519.

What distinguishes the fourth embodiment from the previous embodiments is that the second structure 521 is, for example, a fluorescent layer structure, which simultaneously generates a third light 526 and a fourth light 528. The second structure 521 absorbs a portion of a first light 522 or a portion of a second light 524, or simultaneously absorbs a portion of the first light 522 and a portion of the second light 524 to generate the third light 526 and the fourth light 528. The white-light emitting device 50 then generates a white light 530 by mixing the first light 522, the second light 524, the third light 526, and the fourth light 528. In this embodiment, the first light 522 is an ultraviolet light, the second light 524 is blue light, the third light 526 is green light, and the fourth light 528 is red light, for example.

In this embodiment, the short wavelength light source 507 comprises a hole source layer 511, an active layer 513, and an electron source layer 515. The electron source layer 515 is electrically connected to the circuit substrate 501 by the first electrode 503b and a conductive line 503c. An active layer 513 disposed on the electron source layer 515 is preferably an ultraviolet active layer 513. The first light generated by the short wavelength light source 507 is generated by the ultraviolet active layer 513. A hole source layer 511 is disposed on the ultraviolet active layer 513. The hole source layer 511 is electrically connected to the circuit substrate 501 by the first electrode 503a and the conductive line 503c.

Figure 6:
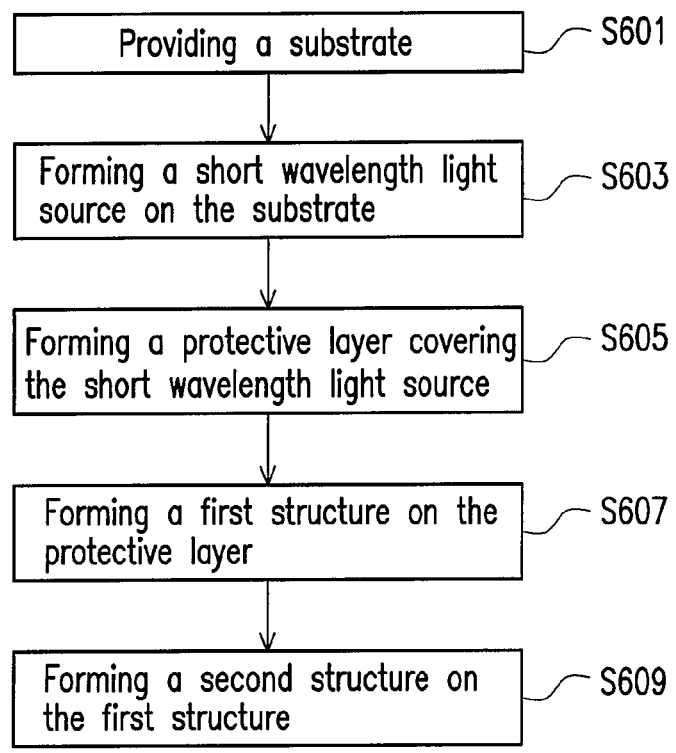
FIG. 6 is a flowchart illustrating a producing method of a white-light emitting device according to an embodiment of the present invention.

FIG. 6 is a flowchart illustrating a producing method of a white-light emitting device according to an embodiment of the present invention. In process S601, a circuit substrate is first provided. Then in process S603, a short wavelength light source is formed on the circuit substrate for generating a first light. In process S605, a protective layer is formed to cover the short wavelength light source. Thereafter, in process S607, a first structure is formed on the protective layer for generating a second light. In process S609, a second structure is formed on the first structure for generating a third light, thereby the first light, the second light, and the third light are mixed to generate a white light.

The process S603 further comprises forming an electron source layer, an active layer, and a hole source layer sequentially on a substrate; forming a first electrode and a second electrode; and electrically connecting the short wavelength light source to the circuit substrate by a conductive line. The process S607 further comprises forming a first quantum well layer and a transmission layer on the protective layer. The process S609 further comprises forming either a second quantum well layer (the first embodiment) or a fluorescent layer (the second embodiment and the fourth embodiment) on the first structure, or simultaneously forming the second quantum well layer and the fluorescent layer (the third embodiment) on the first structure.

In summary, the white-light emitting device and the producing method thereof in the present invention adopt a single-device structure and a LED which generates a multi-chromatic range. Therefore, the structure of the white-light emitting device is simpler and the power consumption thereof is lower. Because the structure of the white-light emitting device is not as complex as a double-device structure, the production cost thereof can be reduced to meet commercial requirements.

Although the present invention has been disclosed by the above embodiments, they are not intended to limit the present invention. Anybody skilled in the art can make some modifications and alterations without departing from the spirit and scope of the present invention. Therefore, the protection range of the present invention falls in the appended claims.

What is claimed is:

1. A white-light emitting device, comprising:
   a circuit substrate;
   a short wavelength light source element disposed on and electrically connected with the circuit substrate for generating a first light;
   a protective layer covering the short wavelength light source element and pervious to the first light;
   a first structure disposed on the protective layer for generating a second light, wherein the first structure comprises a first quantum well layer disposed on the protective layer and a transmission layer disposed on the first quantum well layer; and
   a second structure disposed on the first structure for generating a third light, wherein the first light, the second light, and the third light are mixed to generate a white light.

2. The white-light emitting device of claim 1, wherein the second structure is a second quantum well structure disposed on the transmission layer.

3. The white-light emitting device of claim 2, wherein the first light is a blue light, the second light is a green light, and the third light is a red light.

4. The white-light emitting device of claim 1, wherein the second structure is a fluorescent layer structure disposed on the transmission layer.

5. The white-light emitting device of claim 4, wherein the first light is a blue light, the second light is a green light, and the third light is a red light.

6. The white-light emitting device of claim 1, wherein the second structure comprises:
- a second quantum well structure disposed on the transmission layer for generating the third light; and
- a fluorescent layer structure disposed on the second quantum well structure for generating a fourth light.

7. The white-light emitting device of claim 6, wherein the first light, the second light, the third light, and the fourth light, being an ultraviolet light, a blue light, a green light, and a red light respectively, are mixed to generate a white light.

8. The white-light emitting device of claim 1, wherein the second structure is a fluorescent layer structure disposed on the transmission layer for generating the third light and a fourth light.

9. The white-light emitting device of claim 8, wherein the first light, the second light, the third light, and the fourth light, being an ultraviolet light, a blue light, a green light, and a red light respectively, are mixed to generate a white light.

10. A method for producing a white-light emitting device, comprising:
- providing a circuit substrate;
- forming a short wavelength light source element on the circuit substrate for generating a first light;
- forming a protective layer for covering the short wavelength light source element;
- forming a first structure on the protective layer for generating a second light, wherein the first structure has a first quantum well layer formed on the protective layer and a transmission layer formed on the first quantum well layer;
- forming a second structure on the first structure for generating a third light; and
- mixing the first light, the second light, and the third light to generate a white light.

11. The method of claim 10, wherein the step of forming the second structure comprises forming a second quantum well layer on the transmission layer of the first structure.

12. The method of claim 11, wherein the first light is a blue light, the second light is a green light, and the third light is a red light.

13. The method of claim 11, wherein the step of forming the second structure further comprises forming a fluorescent layer on the second quantum well layer to generate a fourth light mixed with the first light, the second light and the third light to generate a white light.

14. The method of claim 13, wherein the first light, the second light, the third light, and the fourth light are an ultraviolet light, a blue light, a green light, and a red light respectively.

15. The method of claim 10, wherein the step of forming the second structure comprises forming a fluorescent layer on the transmission layer of the first structure to generate the third light.

16. The method of claim 15, wherein the first light is a blue light, the second light is a green light, and the third light is a red light.

17. The method of claim 15, wherein the fluorescent layer is further used for generating a fourth light mixed with the first light, the second light and the third light to generate a white light; and the first light is an ultraviolet light, the second light is a blue light, the third light is a green light, and the fourth light is a red light.

* * * * *